Sept. 11, 1956

D. MACKEY 2,762,987

TUNABLE SIGNAL AMPLIFIER STRUCTURE
AND COUPLING ELEMENTS THEREFOR

Filed April 9, 1953

2 Sheets-Sheet 1

INVENTOR
Donald Mackey
BY
H. L. Newton
ATTORNEY

INVENTOR
Donald Mackey
BY
H. W. Newton
ATTORNEY

United States Patent Office 2,762,987

Patented Sept. 11, 1956

2,762,987

TUNABLE SIGNAL AMPLIFIER STRUCTURE AND COUPLING ELEMENTS THEREFOR

Donald Mackey, Haddon Heights, N. J., assignor to Radio Corporation of America, a corporation of Delaware Application April 9, 1953, Serial No. 347,730

9 Claims. (Cl. 336—75)

This invention relates in general to tunable coupling elements for high frequency or intermediate frequency signal amplifying circuits, and in particular to unitary amplifier structures embodying a plurality of coupling elements of the printed circuit type.

In certain types of high frequency printed circuit amplifier structures, the various components are mounted on a supporting base element and the circuit coupling devices, such as transformers, may have windings that are arranged coaxially or along parallel axes in predetermined spaced relation, to obtain desired inductive coupling. Such construction, however, does not lend itself to the printing of the transformer windings as part of an improved printed circuit structure for a signal amplifier or the like. For example, such construction does not permit printing transformer windings in a single operation and on the same side of an insulating support, as is desirable. However, single printing has been attained in printed circuit transformer construction heretofore where the windings are placed on the same side of a support panel, but in the form of bifilar windings. While this provides close inductive coupling and such construction is easily obtainable in a single printing operation, selective tuning of one or both windings as is also desirable, is not possible.

Accordingly, it is an object of this invention to provide an improved printed circuit high frequency transformer having low-cost simplified coplanar windings and a predetermined degree of inductive coupling between said windings, wherein the windings may be applied to the same surface of a supporting element and inductively coupled to any desired degree by a single printing operation.

It is another object of this invention to provide an improved printed circuit transformer structure wherein adjustable inductive coupling is provided between coupling windings affixed in spaced relation to the same surface of a support element and individually selectively tunable to a desired degree.

Printed circuits and circuit elements are desirable for many applications in electrical equipment because their use often simplifies the manufacture and lowers the cost. In addition, printed circuits and circuit elements are desirable to provide compact electrical equipment in which component parts are readily accessible for replacement or repairs. It is for these and similar reasons that printed circuit transformers and circuits have been found to be of advantage for certain applications, such as for signal amplifying circuits. For this latter application it is desirable that printed circuit transformer structures readily provide for the selective coupling adjustment or tuning of the transformer windings, preferably in such a manner that the adjusting means for the individual windings may face the same portion of the apparatus housing or in the same direction and above a common base, thereby facilitating manufacture and servicing.

Accordingly, it is a further object of the present invention to provide an improved tunable or adjustable printed circuit amplifier structure the tuning or adjustment of the coupling transformer elements of which may be made from substantially one position.

As is well known and understood, the physical location of the windings of a high frequency transformer relative to each other may determine to a large degree the magnitude of inductive coupling between the windings. Accordingly, by moving the windings relative to each other, the inductive coupling between the windings may be varied to a considerable degree. For some applications, however, space limitations prohibit moving the windings of such transformers beyond very narrow limits.

Accordingly, it is still another object of this invention to provide an improved printed circuit transformer structure whereby the degree of inductive coupling between coplanar coupling windings may be determined independently of the relative physical location and spacing of said windings in said structure.

These and further objects of the present invention are achieved by providing a high frequency transformer, the primary and secondary windings of which are printed in coplanar relationship on a rectangular support panel. Desired coupling between the windings is determined by the geometry of the windings, the spacing therebetween, and the relative placement of leads connecting respective terminals of one of the windings to the body of the other winding. Adjustable tuning elements may be mounted on the panel in the approximate center of each of the windings to provide means for controlling the inductance of the windings. The panel is supported between opposite walls of a rectangular housing and a pair of spaced openings in one wall of the housing provide a convenient access to the tuning elements. In a high frequency or intermediate frequency multi-stage amplifying circuit, a plurality of such transformer assemblies is provided on a support member with the spaced openings of the housing facing in one direction.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
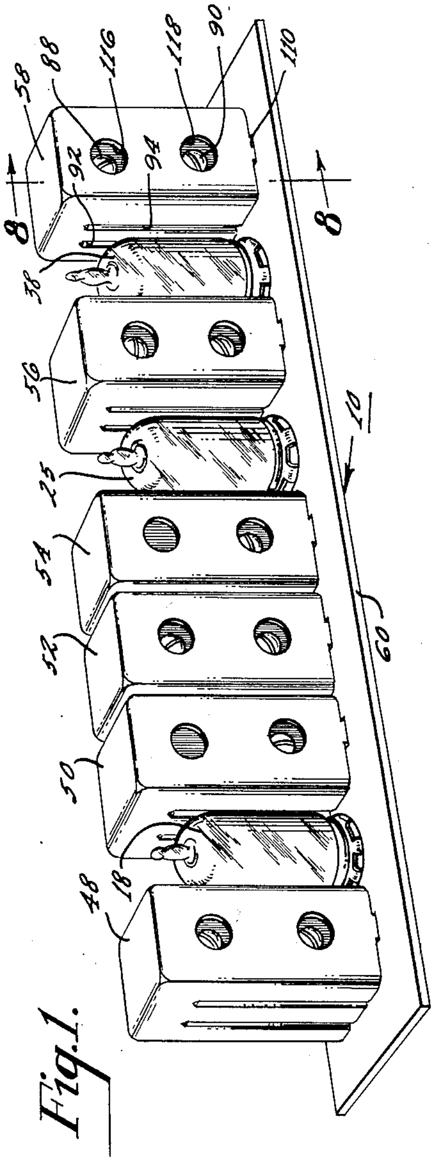
Figure 1 is a view in perspective of a high frequency multi-stage signal amplifier structure embodying the invention.
Figure 2:
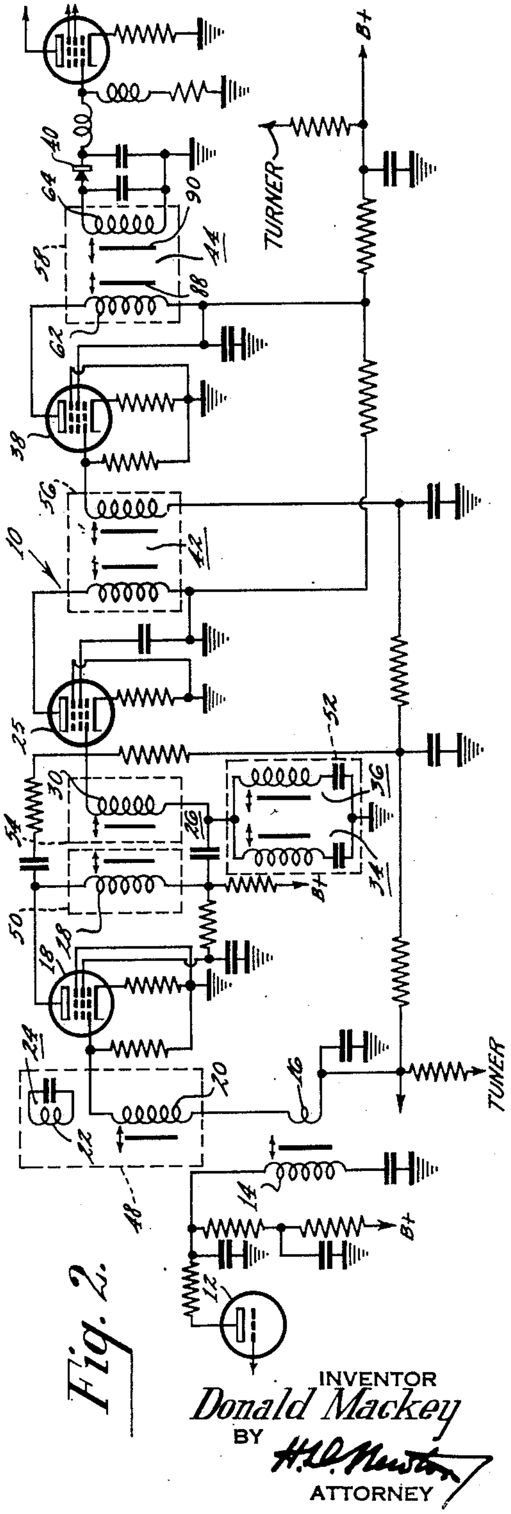
Figure 2 is a schematic circuit diagram of the amplifier structure shown in Figure 1.

Referring now to the drawings, wherein like elements are designated by like reference numerals throughout the various figures, and particularly to Figures 1 and 2, an amplifier structure 10, which may, for example, be the intermediate frequency amplifying section of a typical television receiver, has a mixer 12 (Figure 2) which is coupled through an inductor 14, provided in the output circuit of the mixer 12, and a link coil 16 to a first intermediate frequency (I.-F.) amplifying tube 18. Serially connected between the link coil 16 and the grid of the tube 18 is a variable inductor 20, which is inductively coupled to the inductor 22 of an inductor-capacitor (LC) absorption trap 24. The trap 24 prevents the transfer of signals of predetermined unwanted frequencies to the I.-F. amplifying channel.

The coupling means between the first I.-F. amplifier tube 18 and a second I.-F. amplifier tube 25 includes an M-derived filter 26 comprising a filter plate coil 28 in the output circuit of the first amplifier tube 18 and a filter grid coil 30 in the input circuit of the second I.-F. amplifier tube 25. The low potential ends of the coils 28 and 30 are coupled to a point of reference or ground potential through two series LC filter traps 34, 36 connected in parallel.

A transformer 42 couples the output circuit of the second I.-F. amplifier tube 25 to the input circuit of a third I.-F. amplifier tube 38. The output circuit of the third I.-F. amplifier tube 38 is coupled to the input circuit of a following stage, which may be a signal detector diode 40 by transformer 44. Shields 48, 50, 52, 54, 56 and 58 are provided respectively for housing the inductor 20 and absorption trap 24, the filter plate coil 28, the LC filter traps 34, 36, the filter grid coil 30, the coupling transformer 42 and the coupling transformer 44.

Heretofore, in making adjustments of various coils and transformer windings employed in electronic signal conveying apparatus, such as I.-F. amplifying circuits, it has usually been necessary to remove the apparatus with its supporting chassis from the housing in order to gain access to the respective adjusting means for the coils and transformers. Furthermore, the respective adjusting means have heretofore been generally located so that access to most or all of them cannot be gained without orienting the chassis in a predetermined manner, as by turning it on one side.

The printed coil or transformer winding construction of this invention is standardized as to form, and adjustments can be made without resort to any of the abovementioned methods. Referring now to Figure 1, the shields 48, 50, 52, 54, 56 and 58 of Figure 2 are illustrated, by way of example, as being parallelepiped cans of substantially square cross-section. The shield cans are preferably constructed of aluminum and are mounted on the chassis with one wall of each can facing, or being substantially coplanar with, one side or edge of the chassis 60. Openings may be provided in the coplanar walls to provide access to individual tuning means as will be hereinafter explained. It is in this manner that the various coils and transformer windings can be tuned from one side of the chassis, thereby greatly simplifying alignment procedures.

Figure 3:
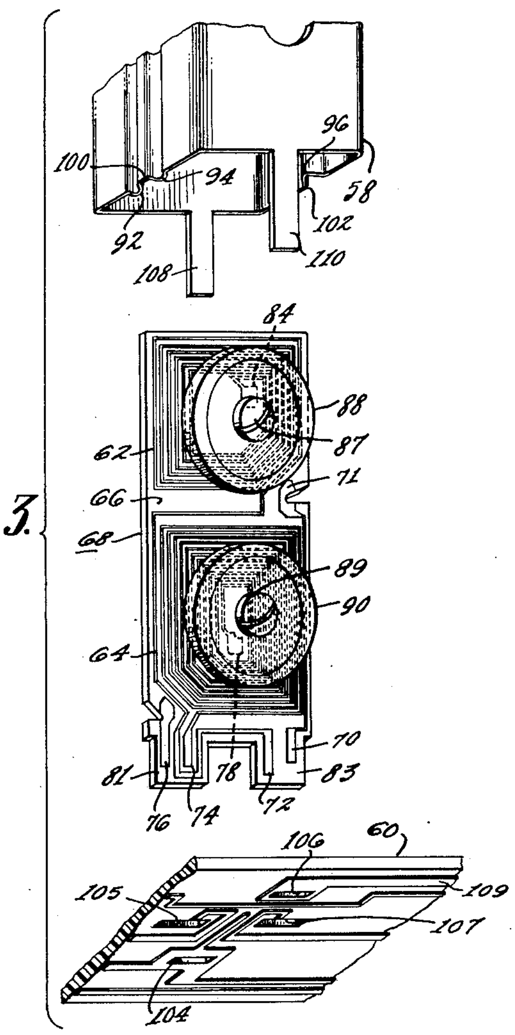
Figure 3 is an exploded view on an enlarged scale, of a printed circuit transformer component of the amplifier structure of Figures 1 and 2 showing its construction in accordance with this invention.
Figure 8:
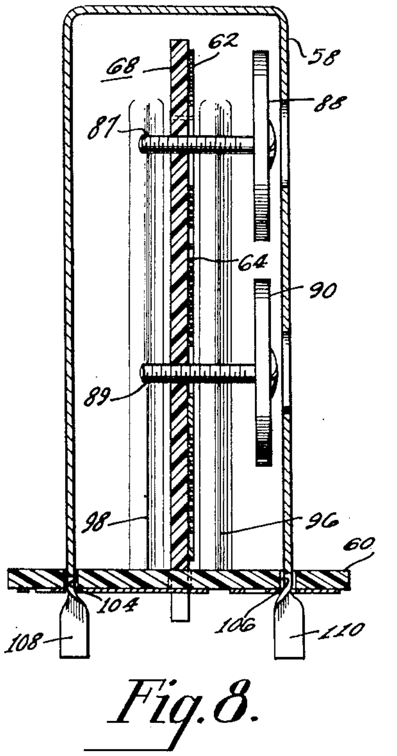
Figure 8 is a sectional side view of a printed circuit transformer component of Figure 3, on a further enlarged scale showing further details thereof.

Referring now more particularly to Figures 3 and 8, a typical high frequency transformer, in accordance with the invention, for example, the transformer 44 of Figure 2, employs flatwound primary and secondary windings 64 and 62 respectively which are placed side by side on one surface 66 of a flat, rectangular support panel 68. The windings 62, 64 are preferably substantially two-dimensional and adhere to the surface 66 of the panel 68 in a desired manner, as by being printed on such surface by means of any one of the well known printed circuit techniques. The printed circuit transformer illustrated in Figure 3 may be considered as being typical for any of the coupling transformers of the amplifying structure.

Terminals 70, 72 for the secondary winding 62, and terminals 74, 76 for the primary winding 64 are printed on the surface 66 in the same operation with the primary and secondary windings. By printing the terminals on the surface 66 of the panel 68 as shown, soldered wire leads connecting the transformer to the external chassis circuit may be eliminated. This can be shown more clearly by referring to the portion of the chassis 60 shown in perspective in Figure 3. A pair of openings 105, 107 are adapted to receive the projecting tabs 81, 83 of the printed circuit panel 68, upon which the transformer terminals 70, 72, 74 and 76 are printed. Electrical contact between the transformer terminals and the selected portions of the chassis printed circuit 109 can then be established by dip-soldering the assembled parts.

Although the terminals 70, 72, 74 and 76 have been illustrated as being located on the end of the panel adjacent the primary winding 64, they obviously could be printed on either end of the panel. Preferably, however, such terminals should be placed at the end of the panel adjacent the higher impedance winding.

To connect the inner end 78 of the primary winding to the terminal 76, a short conductive member (not shown) on the reverse side of the panel 68 therefrom, may have its ends extending through the panel and connected respectively to the inner end 78 of the primary winding and terminal 76. A similar short conductive member (not shown) on the reverse side of the panel 68 may connect the inner end 84 of the secondary winding 62 to the terminal 71 which in turn is connected to the terminal 70.

Individual tuning means for the windings 62, 64 may comprise, for example, washer-head screws 87, 89 which threadedly engage the panel 68 at the centers of the respective windings. The holes for the screws 87, 89 in the panel are sized to provide a friction fit for the screws, whereby they will lock in place in any desired position. The screws 87, 89 as mounted on the panel, have their respective heads 88, 90 positioned adjacent the surface 66 of the panel 68 on which the respective windings 62, 64 are located. Each of the screws 87, 89 is provided with a slot or groove into which an appropriate tool, such as insulated screw driver, may be inserted for adjusting the position of the washer head 88, 98 relative to the respective windings 62, 64.

In a high frequency transformer such as the one described, it has been found that by varying the position of the heads of the washer-head screws relative to the associated transformer windings in the manner previously described, the inductance of each winding can be changed substantially as desired. Accordingly, tuning of the winding over a desired range is obtainable.

The panel 68, upon being inserted in the shield can 58, has the winding supporting surface thereof facing a wall of the shield can in which two spaced openings 116, 118 are provided. These openings 116, 118 are coaxial with the respective screws 87, 89 and thus provide access to the slotted heads 88, 90 of the screws 87, 89. Preferably, the openings 116, 118 are smaller in diameter than the heads 88, 90 of the screws, thereby providing maximum shielding for the windings 62, 64.

The shield can 58, for receiving the above described printed circuit transformer through an opening in one end thereof, is provided adjacent the centers of two of the opposed walls thereof, with longitudinal depressions 92, 94 and 96, 98. The center portions of such walls thus effectively are recess portions, as indicated at 100 and 102, respectively, into which the opposite edges of the transformer panel 68 may be inserted. Accordingly, the panel 68 is mounted by being inserted in the shield can 58, between the recess portions 100, 102 which act as guide channels. Opposite edges of the panel 68 fit into the recess portions 100, 102 and the panel, upon being fully inserted in the shield can 58, is frictionally held therein.

The panel 68 is preferably positioned in the shield can 58 (Figure 4) with the terminals 70, 72, 74, 76 thereof at the lower or open end of the shield can. Thus assembled, the shield can and panel may be mounted in a desired manner, for instance, vertically on the chassis 60, a portion of which is shown in perspective in Figure 3. In a preferred arrangement a pair of openings 104, 106, in the panel 60 receive respective tabs 108, 110 depending from opposed walls of the shield can 58 and a pair of adjacent openings 112, 114 are aligned to receive the terminal bearing portions on the end of the panel 68. The tabs 108, 110 are twisted in the manner indicated in Figure 8 to hold the can 58 and panel 68 in place in a desired position of contact between the terminals 70, 72, 74, 76, the tabs 108, 110, and predetermined portions of a printed circuit located on the bottom of the chassis. That this arrangement may be a distinct advantage in facilitating mass production of printed circuit units may be realized upon observing that, with such an arrangement, a single dip-soldering operation is all that is necessary to complete the finished product, since leads for the terminals 70, 72, 74, 76 are dispersed with.

The degree of inductive coupling between the primary winding 64 and the secondary winding 62 may be varied by moving their physical location on the panel 68 relative to each other. While this expedient may be satisfactory for some applications, it may not be convenient to move the coils beyond very narrow limits in those cases where space limitations and the compactness of the equipment are of concern. In accordance with another feature of the present invention, therefore, the coupling between the windings may be varied without changing the physical location of the coils relative to each other.

Figures 4, 5, 6, 7:
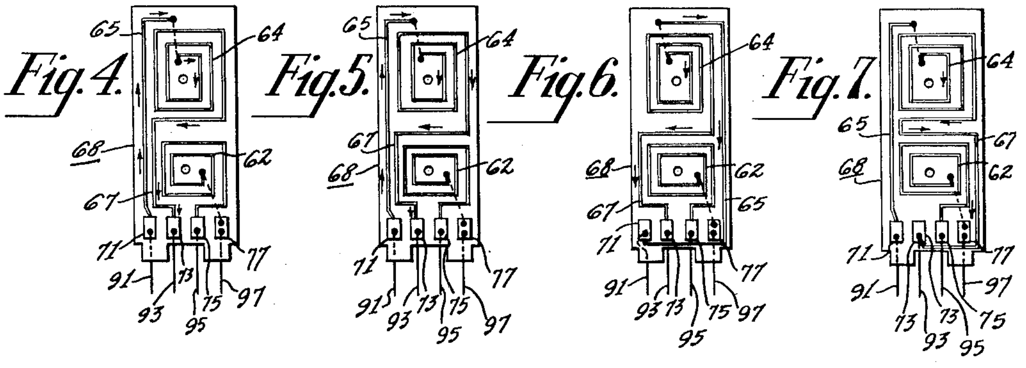
Figures 4, 5, 6 and 7 are views in elevation and substantially on the same scale as Figure 1 of printed circuit transformer elements showing certain modifications of the construction illustrated in Figure 3, in accordance with the invention.

The inductive coupling between the windings, in accordance with this feature of the invention is, in general, varied by changing the disposition of the conductive-connector leads of one winding relative to the other winding. Referring now to Figure 4 the configuration of the connector leads 65, 67 of the primary winding 64 will not appreciably affect the degree of inductive coupling between the primary winding 62 and the secondary winding 62. For this particular configuration, the leads 65, 67 are in close proximity to each other. Accordingly, the inductive coupling between the leads 65, 67 and the secondary winding will not appreciably affect the total coupling between the primary and secondary windings. Thus the total coupling between the windings 62, 64 will be primarily determined by the physical spacing of the windings relative to each other and their particular geometrical configuration.

In Figure 5 the coupling between the primary and secondary windings has been increased by moving a portion of the connector lead 67 in close proximity to the secondary winding 62. In this position the coupling between the secondary winding 62 and the portion of the lead 67 close to the secondary winding is in additive phase with the normal coupling between the primary winding 64 and the secondary winding 62. Thus the total inductive coupling is increased. In this connection, it should be understood that the position of the windings may be reversed on the panel. In the reversed position the connector leads for the secondary winding may determine the degree of inductive coupling.

Figure 6 illustrates a connector lead configuration wherein the total inductive coupling between the primary and secondary windings has been increased to a maximum. As shown in Figure 6 the connector leads 65 and 67 are arranged so that they have a maximum amount of their physical lengths closely coupled to the secondary winding 62 in additive phase. With the connector leads disposed in this manner, there is effectively one turn of the primary winding surrounding the secondary winding. Since the coupling between the leads 65, 67 and the secondary winding 62 is in additive phase with the normal coupling between the primary and secondary windings, the total inductive coupling will be at a maximum.

As shown in Figure 7 the total coupling between the two windings is substantially reduced and by proper disposition of leads and windings can be made to equal zero. In this case the maximum amount of the physical lengths of the connector leads 65, 67 is closely coupled to the secondary winding in non-additive or opposing phase.

Thus it is apparent from consideration of Figures 4, 5, 6 and 7 that the total coupling between the primary and secondary windings can be varied by several hundred per cent if desired without changing the physical location of the windings themselves. The method of changing the configuration of the connector leads to achieve this result is relatively simple yet extremely reliable. This method is, of course, extremely important when the physical size of the equipment should be at a minimum. In addition to these advantages, this technique insures uniformity of coupling between the windings.

Figure 9:
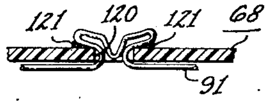
Figure 9 is an end view on an enlarged scale of a printed circuit transformer element showing further modifications of the construction thereof.

In Figures 4, 5, 6 and 7 an alternative method of connecting the transformer windings to the external circuit on the chassis is utilized. Instead of printing the terminals 71, 73, 75 and 77 on the panel 68 in the manner illustrated in Figure 3, terminal leads 91, 93, 95 and 97 may be used to connect the windings to the external circuit. Thus, as shown in Figure 9, the lead 91 may be assembled by forming a slot 120 in the printed circuit panel 68 at the point where contact is to be made. A loop of the terminal lead 91 may then be pulled or "stitched" through the slot. The loop is then crushed as shown to the side of the transformer panel 68 upon which the windings are located. To complete the electrical connection the loop may be soldered as at 121 to the transformer printed circuits. It has been found that this method of assembling the terminal leads to the transformer printed circuit provides an extremely strong and reliable connection.

A practical embodiment of coil and transformer assemblies in accordance with this invention, employed in a television I.-F. amplifier channel (such as that shown in Figure 1), and designed to pass both a picture carrier I.-F. of 45.75 megacycles and a sound carrier I.-F. of 41.25 megacycles has been constructed and tested. Alignment of various stages has been found to be an extremely simple procedure by virtue of the novel arrangement of the coils and transformers in the manner hereinbefore described.

From the foregoing description, it is clear that there has been provided an improved high frequency coil or transformer construction which lends itself to assembly in electronic signal conveying equipment for selective tuning from one side of a supporting chassis. Furthermore, the foregoing arrangement lends itself to mass production of printed circuit coils and transformers having uniform characteristics. Thus controlled production of coil and transformer winding units, within extremely close tolerances is possible.

What is claimed is:

1. A printed circuit transformer assembly for signal amplifying systems and the like comprising in combination, an insulating support plate, printed circuit conductors providing primary and secondary windings affixed to and spaced along one surface of said plate between the ends thereof, means providing terminals for said windings on said surface at one end of the plate whereby one winding is spaced more remotely from said terminals than the other winding, and means including at least one conductor affixed to said surface electrically connecting the terminals to the ends of said winding, said last named conductor extending from one end of the more remote winding along and adjacent to a portion of the conductor of the other winding to effect a predetermined degree of inductive coupling for said transformer between said windings.

2. The combination defined in claim 1 wherein said more remote winding is the primary winding, and wherein the last named conductor connects the inner end of said primary winding to one of said terminals and extends along and adjacent to predetermined outer portions of the secondary winding.

3. The combination defined in claim 1 wherein said more remote winding is the primary winding, and wherein the last named conductor connects the outer end of said primary winding to one of said terminals and extends along and adjacent to predetermined outer portions of the secondary winding.

4. The combination defined in claim 1 wherein said more remote winding is the secondary winding, and wherein the last named conductor connects the inner end of said secondary winding to one of said terminals and extends along and adjacent to predetermined portions of said primary winding.

5. The combination defined in claim 1 wherein said more remote winding is the secondary winding, and wherein the last named conductor connects the outer end of said secondary winding to one of said terminals and extends along and adjacent to predetermined portions of the primary winding.

6. A high frequency transformer assembly comprising in combination, a flat substantially rectangular support panel, two printed circuit windings affixed to and spaced along one side of the panel, means providing terminals for said windings on said one side of said panel, whereby one winding is spaced more remotely from said terminal than the other winding, conductors affixed to said one side of said panel electrically connecting the respective ends of said windings to said terminals, at least one of the conductors for the winding remote from the terminals being oriented with respect to a portion of the other winding to effect a desired degree of inductive coupling between said windings, adjustable inductance changing means for at least one of said windings having a movable control element, and shield means for said windings having a wall provided with an opening for access to said control element whereby tuning adjustment of said winding is facilitated.

7. A printed circuit transformer assembly for signal amplifying systems and the like, comprising in combination, an insulating support plate, printed circuit conductors providing primary and secondary windings affixed to and spaced along one surface of said plate between the ends thereof, means providing terminals for said windings on said surface at one end of the plate, whereby one winding is spaced more remotely from said terminals than the other winding and coupled to said other winding inductively by connections with said terminals and adjustably movable tuning means for certain of said windings mounted in substantially parallel relation on said one surface of said plate at substantially the center portion of the windings.

8. A high frequency transformer assembly comprising in combination, a printed circuit transformer comprising a rectangular insulating support panel and printed circuit inductors providing primary and secondary windings affixed on one surface of said plate, means providing two pairs of terminals for the ends of the respective windings at one end of said panel, printed circuit conductor means connecting the ends of said windings to said terminals, at least one of said conductor means for the winding remote from said terminals being printed on said one surface of said panel whereby the spacing of said one of said leads relative to predetermined portions of the winding adjacent said terminals substantially determines a desired inductive coupling relationship between said windings, a metallic housing substantially enclosing said panel and windings, and individual tuning means having movable control elements supported by said panel at the approximate centers of said windings and in substantially parallel relation to each other within said housing, and means providing an opening in alignment with each of said tuning control elements from one side of said housing whereby the adjustment of said windings in a composite apparatus structure may be facilitated.

9. In a tunable circuit for signal receiving systems and the like, an insulated elongated support panel, a first and a second printed-circuit inductor on one side of said panel, said inductors having integral printed connection-leads and terminal elements on said one side of said panel extending to one end thereof with the leads of one inductor more remote from said end extending adjacent to the outer turns of the other inductor to provide a predetermined degree of inductive coupling between said inductors, a shield casing surrounding said panel and inductors at least in part and having a wall provided with openings aligned substantially with said inductors on the same side of said panel, and movable control means for adjusting the effective inductance of each of said inductors in alignment with said opening, said control means being adapted to be operated by a tool applied thereto through said openings.

References Cited in the file of this patent

UNITED STATES PATENTS

| | | |
|---|---|---|
| 1,596,391 | Bell | Aug. 17, 1926 |
| 1,909,685 | Kenney | May 16, 1933 |
| 2,474,988 | Sargrove | July 5, 1949 |
| 2,483,994 | Davis | Oct. 4, 1949 |

OTHER REFERENCES

National Bureau of Standards Circular 468 "Printed Circuit Techniques," November 15, 1947, page 33, column 1, lines 37–41.

"Printed Unit Assemblies for T. V.," by W. H. Hannahs and N. Stein. Tele Tech, vol. 11, No. 6, June 1952, pp. 38 to 40.